(12) United States Patent
Kaji

(10) Patent No.: US 7,674,985 B2
(45) Date of Patent: Mar. 9, 2010

(54) PRINTED WIRING BOARD ASSEMBLY, METHOD OF MOUNTING COMPONENTS ON PRINTED WIRING BOARD AND ELECTRONIC APPARATUS

(75) Inventor: Keiko Kaji, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 12/128,484

(22) Filed: May 28, 2008

(65) Prior Publication Data
US 2008/0296047 A1  Dec. 4, 2008

(30) Foreign Application Priority Data
May 28, 2007  (JP) ............... 2007-140343

(51) Int. Cl.
*H05K 1/00* (2006.01)
(52) U.S. Cl. ...................... 174/255; 174/252
(58) Field of Classification Search ............... 174/252, 174/255; 29/832
See application file for complete search history.

(56) References Cited
U.S. PATENT DOCUMENTS 5,359,493 A * 10/1994 Chiu .................... 361/719
5,815,374 A * 9/1998 Howell .................. 361/768
6,845,013 B2 * 1/2005 Hartke et al. ............ 361/704
7,444,737 B2 * 11/2008 Worl ....................... 29/601

FOREIGN PATENT DOCUMENTS

| JP | 11-163494 | 6/1999 |
| JP | 11-274363 | 10/1999 |
| JP | 2006-210852 | 8/2006 |

* cited by examiner

*Primary Examiner*—Jinhee J Lee
*Assistant Examiner*—Abiy Getachew
(74) *Attorney, Agent, or Firm*—Knobbe, Martens, Olson & Bear LLP

(57) ABSTRACT

According to one embodiment, there is provided a printed wiring board assembly composed of a printed wiring board having a first component mounting portion provided on one surface of the printed wiring board, a second component mounting portion provided on the other surface of the printed wiring board having the second component mounting portion overlapped partially with the first component mounting portion, a large-scaled ball grid array component mounted on the first component mounting portion, a circuit component mounted on the second component mounting portion, and a supplementary component which is provided on the second component mounting portion of the printed wiring board having a first portion functioning as a heat-sink to remove heat generated from the circuit component and a second portion functioning as a reinforcement portion to reinforce the first component mounting portion.

10 Claims, 3 Drawing Sheets

PRINTED WIRING BOARD ASSEMBLY, METHOD OF MOUNTING COMPONENTS ON PRINTED WIRING BOARD AND ELECTRONIC APPARATUS

CROSS-REFERENCE TO RELATED APPLICATIONS

This application is based upon and claims the benefit of priority from Japanese Patent Application No. 2007-140343, filed May 28, 2007, the entire contents of which are incorporated herein by reference.

BACKGROUND

1. Field

One embodiment of the present invention relates to a printed wiring board assembly having components, such as ball grid arrays (BGA) and the like, mounted on both surfaces of the board.

2. Description of the Related Art

An electronic apparatus, such as a personal computer, is equipped with a printed wiring board on which various semiconductor circuit components are mounted to configure desired functional circuits. The semiconductor circuit component includes a CPU chip, a CPU family chip, and an IO chip. Since a BGA component is large in size and produces much heat, and since the BGA component is bonded to a printed wiring board by means of solder balls arranged in the form of an array on its package back surface, when the printed wiring board is placed in a casing as a circuit board, the printed wiring board will warp due to the thermal deformation or external stress. In the event of such a warp, the solder-mounting surface of the BGA component will be subjected to excessive stress, resulting in failure of the normal bonded condition of the bonded portions. In order to avoid such a disadvantage, a technique has been proposed by which the BGA component solder-mounting surface is reinforced by means of a back plate provided on the other surface (see JP-A No. 2006-210852: KOKAI).

With such a printed wiring board on which a large sized BGA component producing much heat is mounted, when BGA components are each to be mounted on a respective one of the surfaces of the board so that they overlap each other, the solder-mounting surface of the BGA component cannot be reinforced by a back plate with sufficient strength. This problem will also occur when a BGA component is mounted on one surface of a printed wiring board and another circuit component is mounted on the other surface so that they overlap each other.

As described above, when BGA components are each mounted on respective surfaces of a printed wiring board so that they overlap each other, there arises a problem that a back plate to reinforce the BGA component solder-mounting surface cannot be provided. The same problem also arises in a case where a BGA component is mounted on one surface of a printed wiring board and another circuit component is mounted on the other surface so that they overlap each other.

According to one aspect of the present invention, there is provided a printed wiring board assembly comprising: a printed wiring board; a first component mounting portion provided on a first surface of the printed wiring board; a second component mounting portion provided on a second surface of the printed wiring board so that it overlaps the first component mounting portion; a BGA component mounted on the first component mounting portion; a circuit component mounted on the second component mounting portion; and a supplementary component which is provided on the second surface of the printed wiring board and functions as a heat-sink portion to remove heat produced from the circuit component and as a reinforcement portion to reinforce the first component mounting portion.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings.

Figure 1:
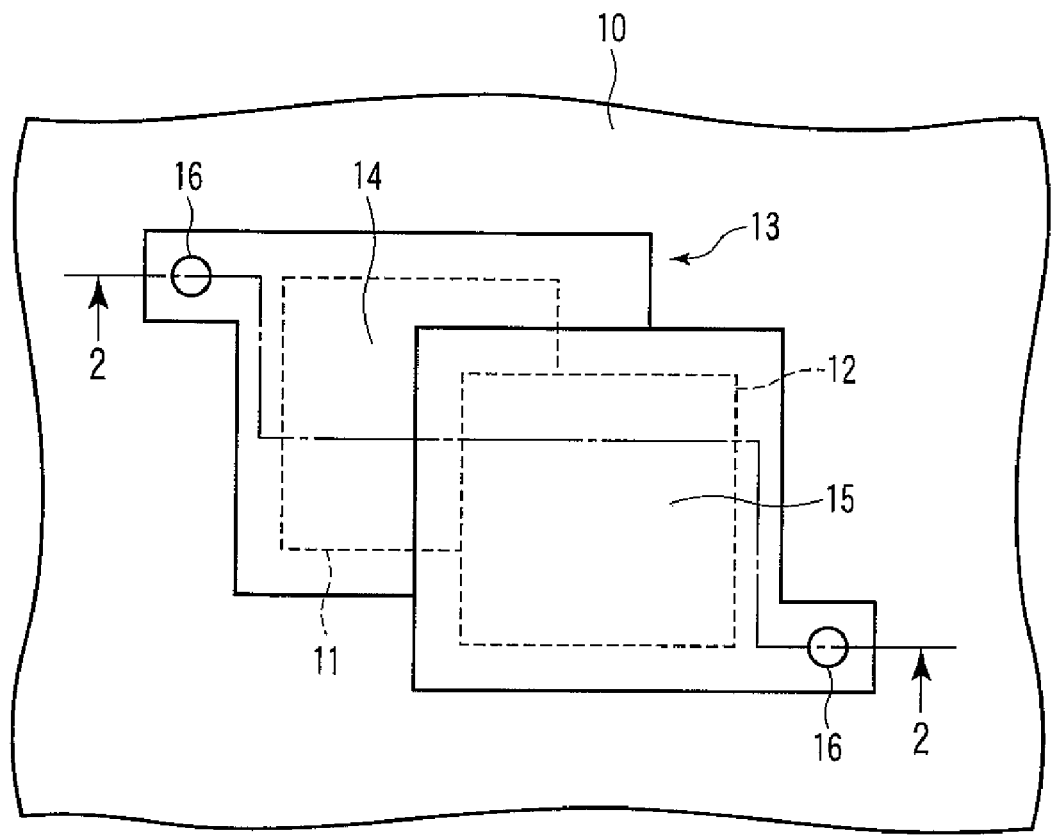
FIG. 1 is a fragmentary plan view of a printed wiring board according to a first embodiment of the present invention.
Figure 2:
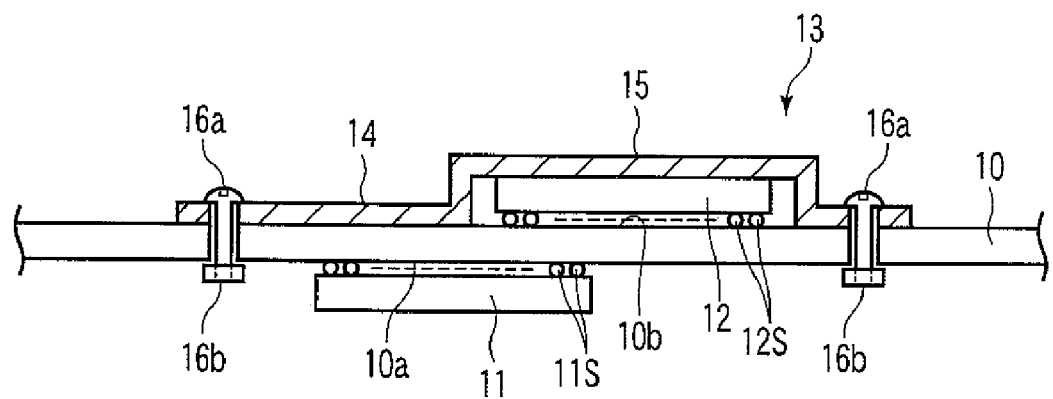
FIG. 2 is a sectional view taken along line 2-2 in FIG. 1.

The assembly of a printed wiring board according to a first embodiment of the present invention is illustrated in FIGS. 1 and 2. FIG. 1 is a fragmentary plan view of the printed wiring board and FIG. 2 is a sectional view taken along line 2-2 in FIG. 1.

The printed wiring board assembly according to the first embodiment of the present invention includes a printed wiring board 10, a first component mounting portion 10a provided on one surface (first surface) of the printed wiring board 10, a second component mounting portion 10b provided on the other surface (second surface) of the printed wiring board 10 so as to overlap the first component mounting portion 10a, a large-scale BGA component 11 mounted on the first component mounting portion 10a, a circuit component 12 mounted on the second component mounting portion 10b, and a supplementary component 13 which is provided on the second surface of the printed wiring board 10 and combines a heat-sink portion 15 that removes heat produced from the circuit component 12 and a reinforcement portion 14 that reinforces the first component mounting portion 10a.

Though not shown, the printed wiring board 10 has a plurality of electrode pads arranged on the first component mounting portion 10a, which are to be solder bonded to electrodes arranged in the form of an array on the package back surface of the BGA component 11. Further, electrode pads are arranged on the second component mounting portion 10b, which are to be solder bonded to electrodes of the circuit component 12.

The large-scale BGA component 11 being mounted on the first component mounting portion 10a of the printed wiring board 10 is solder-bonded to the electrode pads provided on the first component mounting portion 10a by means of solder balls 11S arranged in the form of an array on its package back surface.

The circuit component 12 being mounted on the second component mounting portion 10b of the printed wiring board 10 is a semiconductor circuit component which generates heat in operation. The circuit component 12 is assumed here to be a BGA component which is comparable to the large-scale BGA component 11. The BGA component 12 is solder-bonded to the electrode pads provided on the second component mounting portion 10b by means of solder balls 12S arranged in the form of an array on its package back surface.

Figure 3:
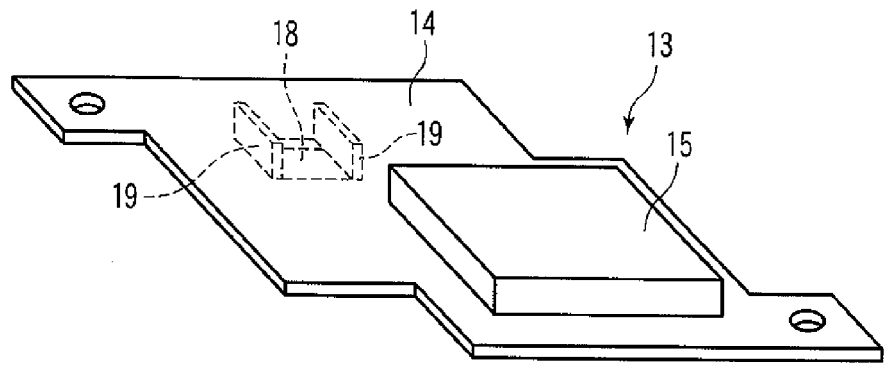
FIG. 3 is a perspective view of the supplementary component according to the first embodiment shown in FIGS. 1 and 2 as well as a supplementary component according to a second embodiment of the present invention.

The supplementary component 13 is of integral construction of the reinforcement portion 14 and the heat-sink portion 15 as shown in FIGS. 1-3. The supplementary portion 13 may be prepared by press working a metal plate made of aluminum, for example.

In the supplementary component 13, a heat-sink portion 15 is formed mainly as a heat radiating plate to remove heat generated from the circuit component 12 and the reinforcement portion 14 is formed mainly as a back plate to reinforce the BGA component mounting portion (the first component mounting portion 10a). The supplementary component 13, which has the heat-sink portion 15 and the reinforcement portion 14 integrated with each other, is fixed to the second surface 10b of the printed wiring board 10 by fixing portions 16 each consisting of a screw 16a and a nut 16b, for example. Although, in this embodiment, the heat-sink 15 is formed in the shape of a box, it may be shaped into a concave form for receiving the component 12 therein.

The reinforcement portion 14 of the supplementary component 13 is in contact with that portion of the second surface of the printed wiring board 10 which corresponds to the first component mounting portion 10a except for the portion overlapping with of the BGA component to reinforce the first component mounting portion 10a. In addition, the heat-sink portion 15 of the supplementary component 13 which is integral with the reinforcement portion 14 also acts as a reinforcement for the BGA component overlapping portion of the first component mounting portion 10a. The reinforcement of the first component mounting portion 10a by the supplementary component 13 suppresses a warp of the first component mounting portion 10a due to thermal deformation of the printed wiring board 10 or externally applied stress. This prevents the generation of stress due to the warp which is applied to the solder-bonded portion of the first component mounting portion 10a in the direction that causes solder-bonded portion to peel off.

On the other hand, the top (heat radiating surface) of the BGA component 12 mounting on the component mounting portion 10b of the printed wiring board 10 is in contact with the back surface of the heat-sink portion 15 directly or with conducting paste or radiating sheet (not shown) interposed between the component 12 and the portion 15. Thereby, heat generated from the BGA component 12 can be removed not only by the heat-sink portion but by the entire supplementary component 13 which is large in surface area and includes the reinforcement portion 14, thus allowing efficient diffusion of heat.

Thus, when one BGA component and another BGA component or a BGA component and a semiconductor circuit component are placed on first and second surfaces, respectively, of a printed wiring board 10 so that they overlap partially in the direction normal to the surfaces of the board 10, the use of the supplementary component 13 which includes integrally formed heat-sink portion 15 and the reinforcement portion (back plate) 14 allows the BGA component mounted on the first surface to be reinforced by the component 13 acting as the back plate and heat produced from the BGA component or semiconductor circuit component mounted on the second surface to be removed efficiently by the component 13 acting as a heat-sink.

A second embodiment of the present invention may be realized by modifying the first embodiment which will be described next with reference to FIG. 3. In the second embodiment, as shown by broken lines in FIG. 3, two raised portions 19 are formed in the reinforcement portion (back plate) 14 to be raised from the upper surface of the back plate 14 to form an opening 18 in the back plate 14. The raised portions 19 are formed as heat-radiating fins. Such a construction allows an electronic component to be placed at the opening 18 and the raised portions 19 to act as the heat-radiating fins.

Figure 4:
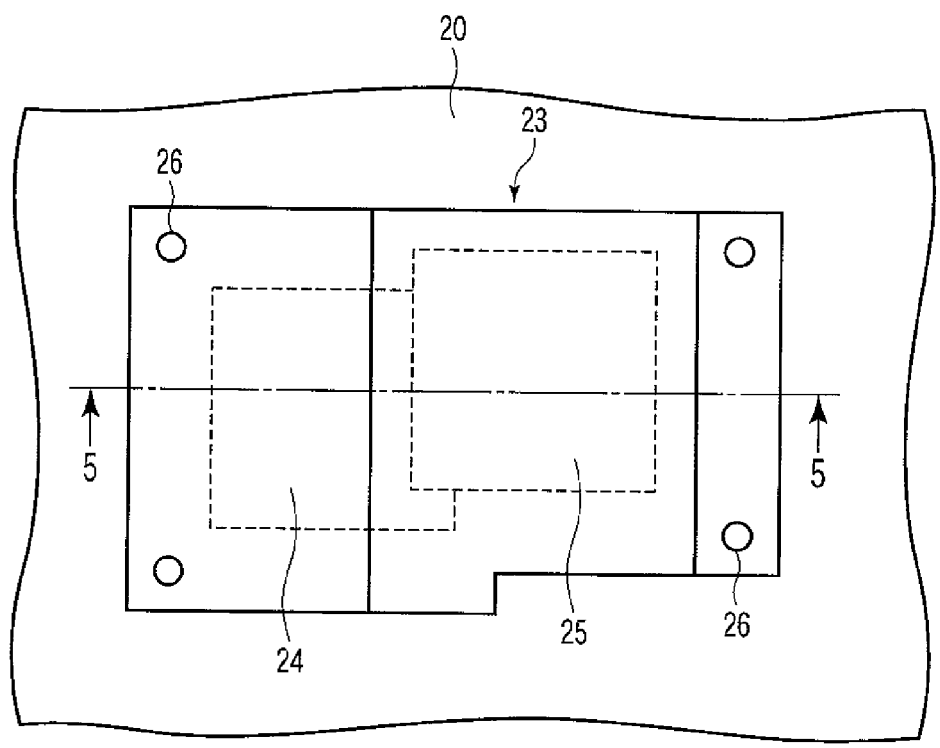
FIG. 4 is a fragmentary plan view of a printed wiring board according to a third embodiment of the present invention.
Figure 5:
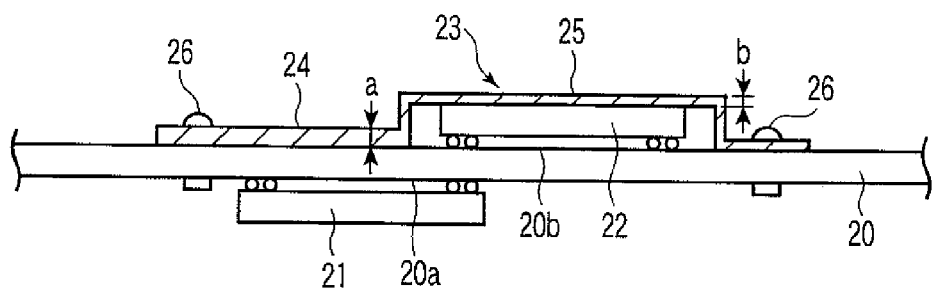
FIG. 5 is a sectional view taken along line 5-5 in FIG. 1.

A third embodiment of the present invention is shown in FIGS. 4 and 5. FIG. 4 is a fragmentary plan view of a printed wiring board and FIG. 5 is a sectional view taken along line 5-5 of FIG. 4.

The printed wiring board assembly according to the third embodiment, as shown in FIGS. 4 and 5, includes a printed wiring board 20, a first component mounting portion 20a provided on one surface (first surface) of the board 20, a second component mounting portion 20b provided on the other surface (second surface) of the board 20 so as to overlap partially the first component mounting portion 10a, a BGA component 21 mounted on the first component mounting portion 20a, a circuit component 22 mounted on the second component mounting portion 20b, and a supplementary component 23 which is provided on the second surface of the board 20 and formed of a combination of a heat-sink portion 25 that removes heat produced from the circuit component 22 and a reinforcement portion 24 that reinforces the first component mounting portion 20a.

The third embodiment is different from the first embodiment in that, of the supplementary component 23 having the heat-sink portion 25 and the reinforcement portion (back plate) 24 integrated with each other, the thickness of the heat-sink portion 25 differs from that of the reinforcement portion 24. In the assembly shown in FIG. 5, the thickness (a) of the reinforcement portion 24 is set larger than that (b) of the heat-sink portion 25, thereby enhancing the effect of reinforcement by the back plate 24.

Figure 6:
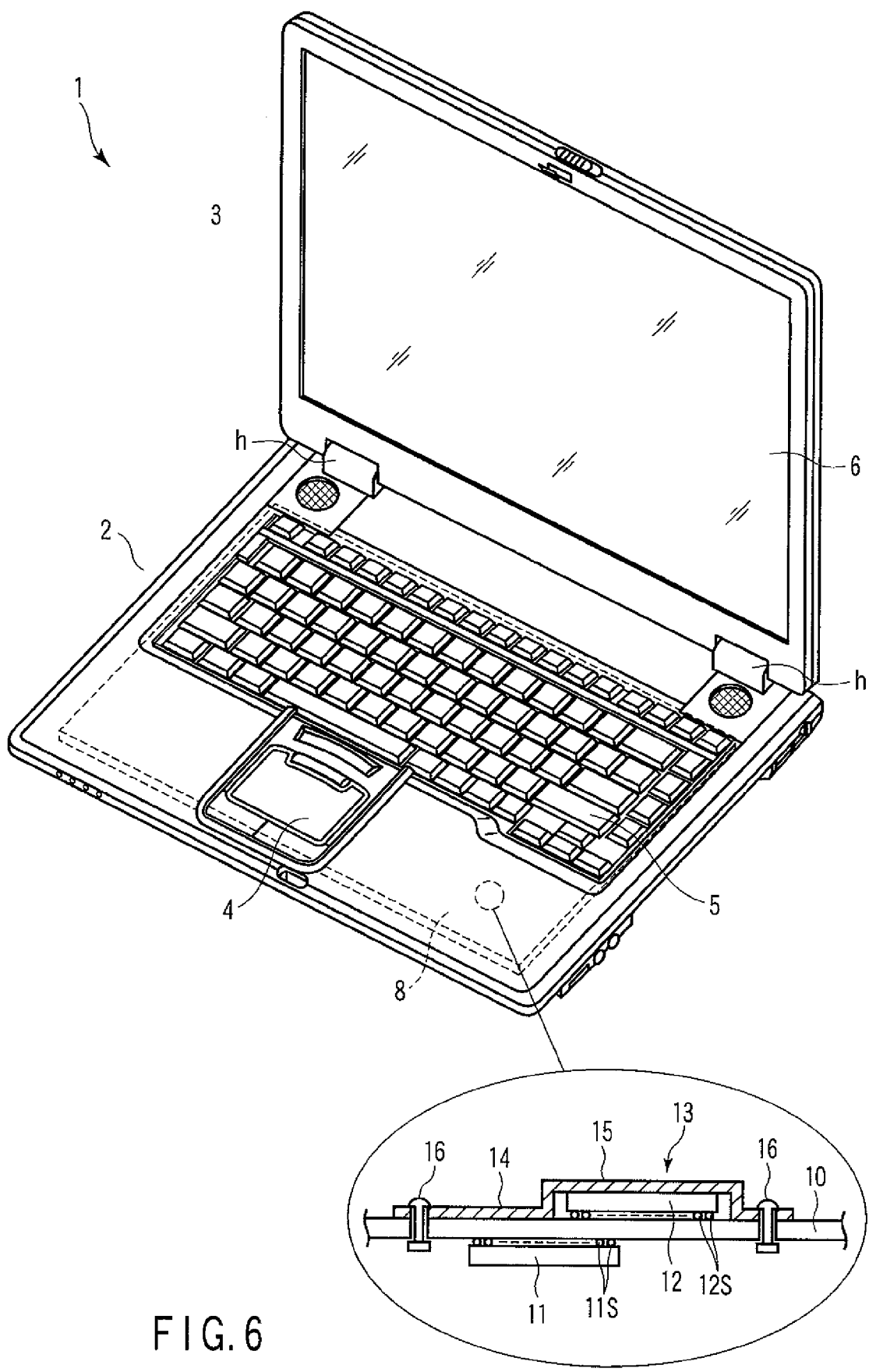
FIG. 6 is a perspective view of an electronic apparatus according to a fourth embodiment of the present invention.

A fourth embodiment of the present invention is illustrated in FIG. 6.

The fourth embodiment is directed to an electronic apparatus which has a printed wiring board manufactured according to the first embodiment built in. FIG. 6 shows an application of such a printed wiring board to a small-sized electronic apparatus, such as a portable computer.

In FIG. 6, a display casing 3 is hinged to the main body 2 of a portable computer 1 by hinge mechanisms h so that the display casing 3 can be swung in an open position or a closed position with respect to the main body 2. The main body 2 is provided with a pointing device 4, a keyboard 5, and so on. A display device 6, such as an LCD, is housed in the display casing 3.

The main body 2 is provided with a circuit board (mother board) 8 which has a control circuit built in to control an operating unit including the pointing device 4 and the keyboard 5 and the display device 6. The circuit board 8 is realized by the printed wiring board 10 of the first embodiment shown in FIG. 1.

The circuit board 8 using the printed wiring board of the first embodiment is provided, as shown in FIG. 6, with BGA component 11 mounted on the first component mounting portion of its first surface, the circuit component 12 mounted on the second component mounting portion of its second surface which overlap partially the first component mounting portion, and the supplementary component 13 which is formed by a combination of the heat-sink portion 15 to remove heat produced from the circuit component 12 and the reinforcement portion (back plate) 14 to reinforce the first component mounting portion.

Thus, when used with a circuit board assembled such that one BGA component and another BGA component or a BGA component and a semiconductor circuit component are placed on first and second surfaces, respectively, of the printed wiring board 10 so that they overlap partially in the direction normal to the surfaces of the board 10, the supplementary component 13 which is integrally formed with the heat-sink portion 15 and the reinforcement portion (back plate) 14 allows the BGA component 11 mounted on the first surface to be reinforced by the back plate 14 and heat produced from the BGA component or semiconductor circuit component 12 mounted on the second surface to be removed efficiently. Thereby, a small-sized electronic apparatus such as the portable computer can be provided which is increased in reliability and the number of components to be mounted on the circuit board 10.

The shape of the supplementary component which is formed integrally by a heat-sink portion and a reinforcement portion is not limited to that shown in the above-described embodiments but may be modified to suit the component mounting designs of a printed wiring board.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A primed wiring board assembly comprising: a printed wiring board; a first component mounting portion on a first surface of the printed wiring board; a second component mounting portion on a second surface of the printed wiring board having at least a part overlapping with at least a part of the first component mounting portion; a ball grid array (BGA) component mounted on the first component mounting portion; a circuit component mounted on the second component mounting portion; and a supplementary component on the second surface of the printed wiring board configured to function either as a heat-sink or as a back plate to reinforce the first component mounting portion, wherein the heat-sink portion comprises a box-shape portion raised from reinforcement portion being in contact with the second surface of the printed wiring board for receiving the circuit component therein, the box-shaped portion of the heat-sink portion being integral with the reinforcement portion to form a reinforcement for the first component mounting portion of the printed wiring board.

2. The printed wiring board assembly of claim 1, wherein the supplementary component includes a heat-sink portion and a back plate portion for reinforcement which are integrated with each other.

3. The printed wiring board assembly of claim 2, wherein the circuit component is a surface mounting circuit component.

4. The printed circuit board assembly of claim 3, wherein the circuit component is a BGA component.

5. The printed circuit board assembly of claim 2, wherein a thickness of the heat-sink portion and a thickness of the back plate portion are different on the supplementary component.

6. The printed circuit board assembly of claim 1, wherein the heat-sink portion is provided with an opening.

7. The printed wiring board assembly of claim 6, wherein the opening is provided on the surface portion of the board with radiating fins formed of raised portions raised from the surface portion.

8. An electronic apparatus comprising: a main body; and a circuit board contained in the main body, the circuit board comprising a BGA component mounted on a first component mounting portion of its first surface, a circuit component mounted on a second component mounting portion of its second surface configured to overlap at least partially the first component mounting portion; and a supplementary component on the second surface of the printed wiring board, formed of a combination of a heat-sink portion and a reinforcement portion to reinforce the second component mounting portion, wherein the heat-sink portion comprises a box-shape portion raised from the reinforcement portion being in contact with the second surface of printed wiring board for receiving the circuit component therein, the box-shaped portion of the heat-sink portion being integral with the reinforcement portion to form a reinforcement for the first component mounting portion of the printed wiring board.

9. The printed circuit board assembly of claim 1, wherein the supplementary component has an area surrounded by an outer edge of the supplementary component larger than an area of the BGA component plus an area of the circuit component, so that heat generated from the circuit component can be removed not only by the heat-sink portion but by the reinforcement portion and the BGA component mounting portion is reinforced by the reinforcement portion.

10. The printed circuit board assembly of claim 1, wherein the heat-sink portion comprises a concave raised from the reinforcement portion, the heat-sink portion being in contact with a surface of the circuit component received in the concave, the concave of the heat-sink portion being integral with the reinforcement portion to form a reinforcement for the first component mounting portion of the printed wiring board.

* * * * *